United States Patent
Inui et al.

(10) Patent No.: US 7,381,632 B2
(45) Date of Patent: Jun. 3, 2008

(54) SEMICONDUCTOR THIN FILM CRYSTALLIZATION DEVICE AND SEMICONDUCTOR THIN FILM CRYSTALLIZATION METHOD

(75) Inventors: Tetsuya Inui, Nara (JP); Junichiro Nakayama, Kyoto-fu (JP); Yoshihiro Taniguchi, Nara (JP); Masanori Seki, Tenri (JP); Hiroshi Tsunasawa, Kyoto-fu (JP); Ikumi Kashiwagi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 374 days.

(21) Appl. No.: 11/190,707

(22) Filed: Jul. 26, 2005

(65) Prior Publication Data

US 2006/0019474 A1    Jan. 26, 2006

(30) Foreign Application Priority Data

Jul. 26, 2004    (JP)    ............... P2004-217089

(51) Int. Cl.
    *H01L 21/36* (2006.01)
(52) U.S. Cl. .............. 438/487; 438/486; 438/795; 438/799
(58) Field of Classification Search ......... 438/487, 438/486, 166, 795, 799
    See application file for complete search history.

(56) References Cited

U.S. PATENT DOCUMENTS

| 6,174,790 | B1 * | 1/2001 | Yang ............... 438/487 |
| 6,392,810 | B1 * | 5/2002 | Tanaka ............. 359/622 |
| 6,800,541 | B2 * | 10/2004 | Okumura ........... 438/487 |
| 7,063,999 | B2 * | 6/2006 | Tanabe et al. ....... 438/62 |
| 2004/0053480 | A1 * | 3/2004 | Tanabe et al. ....... 438/487 |

FOREIGN PATENT DOCUMENTS

| JP | 11307450 | 11/1999 |
| JP | 2000-505241 | 4/2000 |
| JP | 2001044120 | 2/2001 |
| JP | 2001-176797 | 6/2001 |
| WO | WO 97/45827 | 12/1997 |

* cited by examiner

*Primary Examiner*—Michael Trinh
(74) *Attorney, Agent, or Firm*—George W. Neuner; David G. Conlin; Edwards Angell Palmer & Dodge LLP

(57) ABSTRACT

A first laser beam is emitted from a first laser oscillator in a pulsed manner at a high repetition frequency, and converged onto a substrate by a first intermediate optical system 2 so as to form a slit-like first beam spot. A second laser beam is emitted from a second laser beam oscillator in a pulsed manner to rise precedent to and fall subsequent to the first laser beam, and converged onto the substrate by a second intermediate optical system so as to form a second beam spot similar in configuration to the first beam spot and to contain the first beam spot. Crystallization of a semiconductor thin film on the substrate is carried out while the substrate or the first, second beam spots are moved. Thereby, the whole semiconductor thin film is formed into a crystal surface that has grown in one direction and free from ridges. Thus, the semiconductor thin film has an extremely flat surface, extremely few defects, large crystal grains and high throughput.

6 Claims, 8 Drawing Sheets

*Fig.7*
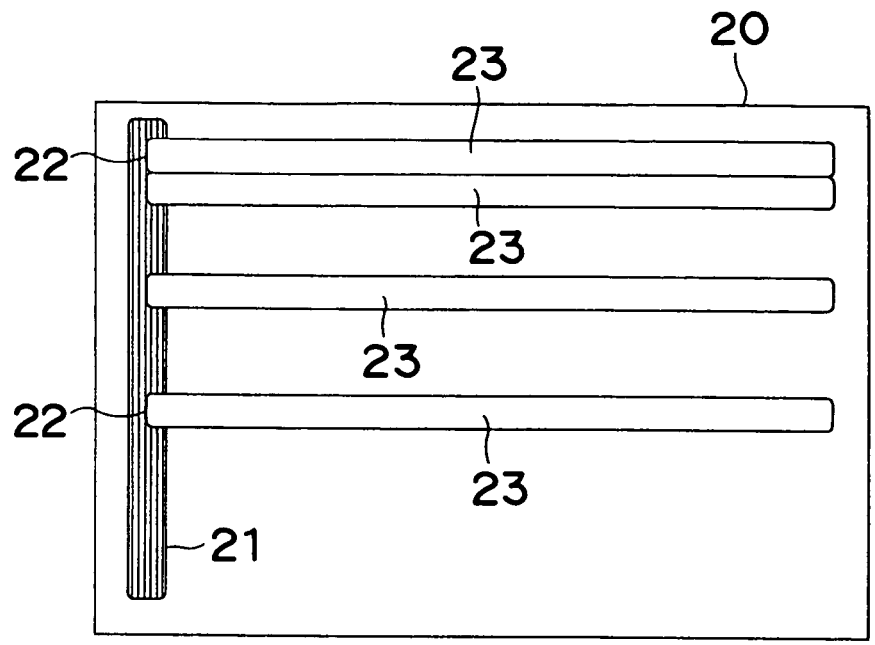
*Fig.8A*  *Fig.8B*
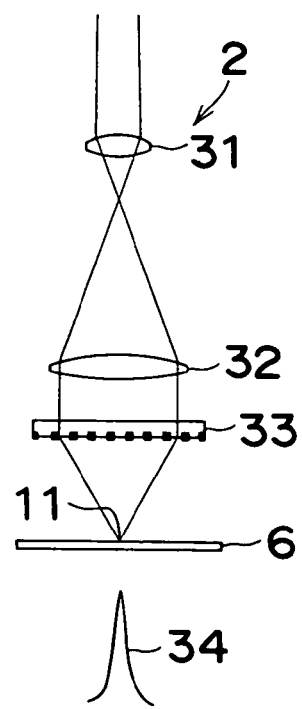 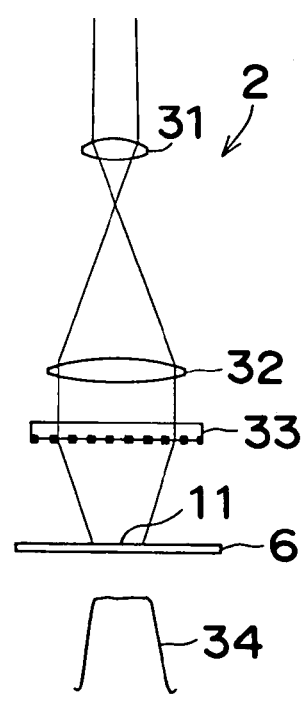

SEMICONDUCTOR THIN FILM CRYSTALLIZATION DEVICE AND SEMICONDUCTOR THIN FILM CRYSTALLIZATION METHOD

CROSS-REFERENCE TO RELATED APPLICATIONS

This nonprovisional application claims priority under 35 U.S.C. §119(a) on Patent Application No. 2004-217089 filed in Japan on 26 Jul. 2004, the entire contents of which are incorporated herein by reference.

BACKGROUND OF THE INVENTION

The present invention relates to a semiconductor thin film crystallization device and a semiconductor thin film crystallization method, for crystallizing semiconductor thin film by using laser.

In recent years, thin film transistors (hereinafter, referred to as TFTs) using polysilicon film have been drawing attention among TFTs under development. In particular, LCDs (Liquid Crystal Displays) or EL (Electro-Luminescence) Displays employ TFTs in which polysilicon film is used as elements for switching pixels or as elements that form part of the driver circuit for controlling the pixels.

Generally, as the method for obtaining the polysilicon film, amorphous silicon film is crystallized to provide polysilicon film. Recently, attention has been given particularly to a method of crystallizing amorphous silicon film by using laser light. In this case, crystallization by laser makes it possible to achieve the crystallization by heating only the semiconductor film such as the amorphous silicon film. Therefore, this method is an effective method for forming a crystallized semiconductor film on a substrate of low heat resistance such as glass substrates or plastic substrates. This crystallization method for semiconductor film by using laser light is disclosed in detail in JP 2001-44120 A (hereinafter, referred to as patent document 1), JP H11-307450 (patent document 2) and JP 2000-505241 A (patent document 3).

The patent document 1 describes a laser heat treatment device that improves the crystallinity by using a plurality of light sources. The document further describes, in particular, the use of an ultraviolet ray as a main light source and a pulsed beam emitted from a solid state laser as a subordinate light source.

The patent document 2 discloses a thin film reformer for performing crystallization with radiation of two types of laser light as in the laser heat treatment device of the patent document 1. The document 2 further describes, in particular, that laser light which does not show large absorption for semiconductor film but shows large absorption for the substrate, such as carbonic acid gas laser, is used to improve the crystallinity of the substrate, which makes it possible to improve the characteristics of transistors or the like fabricated on the substrate of improved crystallinity.

The patent document 3 discloses a crystallization process of a semiconductor region on the substrate wherein a linear or slit-shaped beam is applied to a semiconductor region on the substrate in the lateral direction so as to make such crystal growth that crystals of the semiconductor film are grown largely in the lateral direction. However, in the case of the crystallization process for the semiconductor region on the substrate disclosed in the patent document 3, the distance of lateral growth by one time irradiation is about 1 micron to 2 microns. Therefore, the above-described crystal growth needs to be repeated as required in order to crystallize a large-area semiconductor film.

Various laser devices are available for laser devices to be used for the methods described above. First of all, in terms of the form of oscillation, laser devices are roughly divided into pulsed laser devices that perform pulsed oscillation and continuous wave laser devices that perform continuous oscillation. Although both devices are used for crystallization of the semiconductor film, yet the pulsed laser devices are widely used for crystallization of semiconductor film because of an advantage capable of instantaneously giving large power.

Currently, pulsed oscillation type excimer laser devices are available as laser devices which are commonly used for crystallization of the semiconductor film. In the devices, the repetition frequency of pulsed oscillation is about 1 Hz to 300 Hz. The excimer laser device is large in output power, and the oscillation light is high in absorption coefficient for silicon film because of the oscillation light being ultraviolet rays. Moreover, the oscillation light of the excimer laser device is capable of instantaneously heating by virtue of their short pulse width. Thus, the excimer laser device has an advantage that making the semiconductor film fused does not involve so much increase in the substrate temperature.

However, excimer laser devices need such gas as krF (wavelength: 248 nm) or XeCl (wavelength: 308 nm) for oscillation, and gas supply units for these gases are expensive. Further, since replacement of gas, replacement of oscillating tubes, replacement of optical windows and the like are regularly necessitated. This disadvantageously leads to high maintenance cost.

Further, other laser devices with the medium given by argon gas or carbonic acid gas have also been used as gas laser devices. In particular, carbonic acid gas laser devices are high in efficiency, allowing high output power to be obtained with relatively small-sized equipment.

Besides, it is also possible to use laser light derived from an oscillation source given by a solid state laser device (a laser device that outputs laser light with a crystal rod used as its resonant cavity). Such solid state laser devices are given by commonly known ones, being exemplified by YAG lasers (which normally mean Nd:YAG lasers), Nd:YVO$_4$ lasers, Nd:YAlO$_3$ lasers, ruby lasers, Ti:sapphire lasers, glass lasers and the like. Since YAG lasers have a fundamental wave (first higher harmonic) whose wavelength is as long as 1064 nm, the second harmonic (wavelength: 532 nm), the third harmonic (wavelength: 355 nm) or the fourth harmonic (wavelength: 266 nm) is used in some cases. It is noted that the fundamental wave can be modified to the second harmonic, the third harmonic or the fourth harmonic by a wavelength modulator including nonlinear elements. The formation of those harmonics is performed according to known techniques.

Also, in some cases, the Q-switching method (Q-modulation switching method) is used. The Q-switching method is often used for the YAG lasers. This is a method that the Q value is abruptly increased from a sufficiently low Q value state of the laser resonator to produce a sharp pulsed laser of quite high an energy value. In this method, the repetition frequency of the pulsed oscillation is 100 to several tens kHz. These are known techniques.

Although various semiconductor film crystallization methods using laser devices have been proposed as described above, there have been also proposed methods for crystallizing a semiconductor film in combination with the plural kinds of laser devices as well as a single laser device.

Further, in the prior art, there have been provided many proposals for the method of crystallinity improvement and the method of throughput (processing speed per unit time) improvement in the process of performing the crystallization of semiconductor film by using laser light.

However, the prior arts described in the aforementioned patent documents 1 to 3 have the follow disadvantages.

Both the patent documents 1 and 2 describe that the crystallinity of the semiconductor film can be improved with the use of two types of laser light. In particular, the patent document 1 discloses in detail the relations among the irradiation intensity of laser light, the mobility of transistors and the size of crystal grains. However, as an example, the mobility is 100 cm$^2$/Vs to 150 cm$^2$/Vs at most, the value being very low as compared with single crystal silicon or the like.

This is because only using plural types of laser light does not allow acceleration of the crystal growth so much, and therefore, to achieve a drastic increase of the size of crystal grains, as stated in the patent document 1. As a consequence, it is impossible to improve the characteristics of transistors by improved crystallinity of the semiconductor film.

In the patent document 3, laterally elongated crystals are made, thereby, transistors are formed with the channel direction coincident with the growth direction of the crystals, which makes it possible to fabricate transistors having a mobility of 300 cm$^2$/Vs to 400 cm$^2$/Vs or over. However, the length of crystals grown by one-time irradiation is 1 micron to 2 microns as described above, and therefore, there is a need for stringing the crystals one after another, which leaves a great issue unsolved in terms of throughput.

Furthermore, in the prior arts disclosed in the patent documents 1 to 3, there occurs a protrusion, so called "ridge", at each grain boundary portion of the formed crystals. The ridge is caused by collisions of crystals that have grown in different directions. The ridge has a height comparable to film thickness of the semiconductor film to be crystallized. Then, if the channel portion of a transistor for example is formed at a portion where the ridge is generated, there occurs a phenomenon that electric fields concentrate to the ridge (protrusion) portion to incur a breakdown, which gives rise to an issue of deterioration in reliability of the transistors. Besides, the ridge portion is thick in film thickness and has defects concentrated thereabout, transistors whose channel is formed at the ridge portion are generally poor in characteristics and not for practicable use.

In addition, the patent document 3 discloses a method where a transistor is formed in no ridge region which is formed between lateral crystals after stringing the lateral crystals one after another. Though it is possible to form a transistor in no ridge region, deterioration of throughput is inevitable in ensuring large areas free from ridges. Besides this, transistors need to be placed so as not to overlap the ridges. In this case, the transistor is placed after the completion of crystallization and forming a pattern. Therefore, it is necessary to predict the ridge positions preparatorily with an extremely high accuracy and place the ridges so that interference with the ridges does not occur in the later process of forming the transistors. The placement accuracy of the ridges in such a case needs to be, generally, equivalent to that of the placement of the transistors. For this purpose, equipment for performing the crystallization process in semiconductor regions on the substrate generally requires a level of accuracy equivalent to that of exposers for pattern formation, thus the price of the equipment being very expensive.

In the method of forming the lateral crystal growth in the semiconductor regions on the substrate disclosed in the patent document 3, fabrication of flat crystals free from ridges is hard to achieve under practical conditions although achievable under certain limited conditions.

In order to manufacture high-performance thin film transistors, it is necessary to obtain crystals having flat surfaces, less defects and large crystal grains at high throughput. However, it is hard to make the crystals that satisfy these characteristics at the same time in the prior arts disclosed in the patent documents 1 to 3. That is, from the patent documents 1 to 3, it is impossible to obtain a practical crystallization method which satisfies both the obtainment of crystals having high-performance crystallinity: less defects and less grain boundaries and flat surfaces, and the capability of high throughput at the same time even if any types of laser light either alone or in combination is used. In other words, the prior arts disclosed in the patent documents 1 to 3 make it possible only to obtain crystals having a capability of fabricating thin film transistors for liquid crystal panel used at a level of 100 cm$^2$/Vs to 200 cm$^2$/Vs in mobility.

SUMMARY OF THE INVENTION

An object of the present invention is to provide a semiconductor thin film crystallization device and a semiconductor thin film crystallization method both of which are capable of obtaining channel surface having extremely flat surfaces and extremely few defects and large crystal grains and also capable of obtaining high throughput.

In order to achieve the above-mentioned object, the present invention provides a semiconductor thin film crystallization device comprising:

a first laser irradiation unit for emitting a first laser beam and forming a striped first beam spot having a specified width and a specified length on a semiconductor thin film on a substrate;

a second laser irradiation unit for emitting a second laser beam and forming a second beam spot having a shape containing the first beam spot on the semiconductor thin film; and a relative moving unit for moving the substrate in a widthwise direction of the first beam spot relatively with respect to the two beam spots, wherein the second laser irradiation unit emits the second laser beam at least while the first laser beam is being emitted, and maintains intensity of the second laser beam constant at a level lower than a maximum intensity of the first laser beam and during a period from an emission start time to an emission end time, and a light intensity distribution by the second laser irradiation unit within the second beam spot is constant at least in a portion overlapping with the first beam spot.

In this case, the second laser beam emitted from the second laser irradiation unit can be worked subserviently to the first laser beam emitted from the first laser irradiation unit. Therefore, temperature increases of the whole substrate can be prevented, so that deformation of the substrate due to thermal expansion can be prevented.

Further, the semiconductor thin film on the substrate is fused from a start of one time irradiation with the first laser beam and the second laser beam, and cooled after the irradiation so as to be solidified and crystallized. The fusion of the semiconductor thin film in this case occurs generally within the first beam spot. The crystallization and solidification make progress in the widthwise direction of the first beam spot from both edge portions toward the central portion. Accordingly, since crystals grow from the two edge portions of the first beam spot to the generally central portion, it is possible to obtain crystals having an average growth length more than several times, specifically about ten times, larger than the conventional average growth length described in the patent document 3. Thus, according to the present invention, tenfold throughput can be obtained as compared with the conventional crystallization device, so that the invention leads to an extremely high productivity.

Furthermore, by moving the substrate in the widthwise direction of the first beam spot relative to the first and second beam spots, it becomes possible to obtain continuously, laterally grown crystals while taking over the crystals that have grown by one time irradiation with the first and second laser beams. In this case, it is possible to achieve the crystallization in shorter time all over the semiconductor thin film by speeding up the relative moving speed of the substrate. This is because crystals of about ten times the conventional growth length can be obtained by one time irradiation with the first and second laser beams as described above. Further, according to the present invention, the continuous crystallization can be implemented from one end portion to the other end portion of the semiconductor thin film, and therefore, it is possible to grow crystals free from the presence of ridges therebetween so that their surfaces are extremely flat.

That is, according to this invention, crystals can be obtained which have extremely few defects and which are good in quality and close to the single crystal. Also, as a result of the obtainment of crystals of less defects, there can be obtained an effect that crystal defects have less influence no matter how the channel of the transistors is oriented, thus eliminating constraints on the orientation of the transistor placement.

In one embodiment of the present invention, the specified width in the striped first beam spot is not less than 5 micron and not more than 50 microns.

As described above, the semiconductor thin film crystallization device of this invention is capable of obtaining crystals whose growth length is about ten times the conventional average growth length, more specifically, crystals whose growth length is 2.5 microns to 25 microns for one time irradiation. Thus, according to this embodiment, there can be obtained crystals of large crystal grains which have grown from both edge portions to generally central portions in the widthwise direction of the first beam spot by one time irradiation with the first laser beam.

In one embodiment of the present invention, the second laser beam emitted by the second laser irradiation unit is a carbonic acid gas laser beam.

According to this embodiment, it is possible to use a laser beam of pulsed oscillation as the second laser beam.

In one embodiment of the present invention, the second laser irradiation unit emits the second laser beam in a pulsed manner.

According to this embodiment, the second laser beam is a laser beam of pulsed oscillation. Setting the second laser beam to a shorter irradiation time makes it possible to heat the substrate in a state closer to heat-insulation. As a result of this, the heat escape of the second laser beam due to thermal diffusion can be reduced before the irradiation with the first laser beam. Thus, the region to be heated is limited to the surface of the substrate, which makes it achievable to heat only the substrate surface with a less amount of heat.

In one embodiment of the present invention, emission frequency of the first laser beam by the first laser irradiation unit is not less than 1 kHz and not more than 100 kHz.

According to this embodiment, since the emission frequency of the first laser beam is as high as 1 kHz to 100 kHz, it is possible to enhance the moving speed of the substrate, so that the productivity is improved. The moving speed of the substrate is determined by "moving distance for one time irradiation" multiplied by "repetition frequency of oscillation of first and second laser beams."

In one embodiment of the present invention, the relative moving unit is a substrate driver section on which the substrate is placed and which is enabled to move the substrate from one end portion to other end portion of the substrate in a widthwise direction of the beam spot and to rotate the substrate by 90°.

According to this embodiment, after one side portion of the semiconductor thin film on the substrate is crystallized in a strip shape along the one side (first strip crystallization), it is possible to rotate the substrate by 90° and to crystallize a plurality of strip regions extending from the one side portion of the semiconductor thin film toward the other side portion (second strip crystallization), with the start position given by a position within the crystallized strip region. Thus, the start position for performing the second strip crystallization is located within the crystallized strip region, and therefore, a crystal in the second strip crystallization starts to grow with the start point given not by crystal nuclei generated randomly from end portions but by a crystal elongated in the longitudinal direction of the crystallized strip region. As a consequence, the crystal that grows by the second strip crystallization becomes a single crystal of an extremely large width or almost such a crystal.

The present invention also provides a semiconductor thin film crystallization method comprising the steps of:

irradiating a semiconductor thin film on a substrate with a first laser beam to form a striped first beam spot having a specified width and a specified length on the semiconductor thin film;

irradiating the semiconductor thin film with a second laser beam to form a second beam spot having a shape containing the first beam spot on the semiconductor thin film; and moving the substrate relative to the two beam spots in a widthwise direction of the first beam spot to crystallize the semiconductor thin film on the substrate by the first and second laser beams, wherein the irradiation with the second laser beam is performed at least while the irradiation with the first laser beam is being performed, intensity of the second laser beam is maintained constant during a period from an emission start time to an emission end time, and light intensity of the second laser beam within the second beam spot is maintained constant at least over portions overlapping with the first beam spot.

According to the embodiment, temperature increases of the whole substrate can be prevented by working subserviently the second laser beam to the first laser beam, which resultantly prevents deformation of the substrate due to thermal expansion. Further, the average growth length of crystal can be made about ten times the conventional average growth length described in the patent document 3. Accordingly, tenfold throughput can be obtained as compared with the conventional crystallization device. Besides, by moving the substrate relatively in the widthwise direction of the first beam spot, continuously laterally grown crystals can be obtained. In this case, it becomes possible to achieve the crystallization in shorter time all over the semiconductor thin film by speeding up the relative moving speed of the substrate. Further, the continuous crystallization can be implemented from one end portion to the other end portion of the semiconductor thin film, and there can be grown crystals which are free from the presence of ridges therebetween so that their surfaces are extremely flat.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is an explanatory view of the second crystallization method;

FIGS. 8A and 8B are views showing a specific configuration of a first intermediate optical system in FIG. 1;

DETAILED DESCRIPTION OF THE INVENTION

Figure 1:
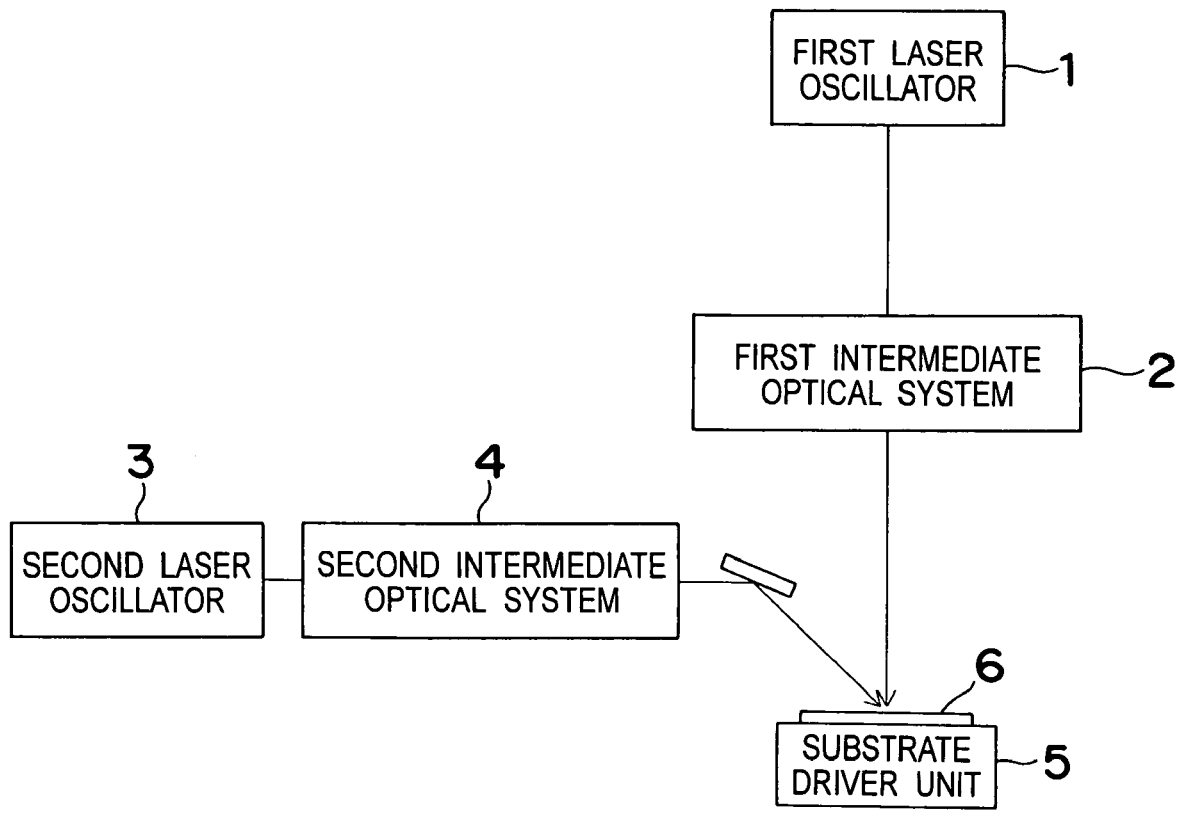
FIG. 1 is a view showing a configuration of a semiconductor thin film crystallization device according to the present invention.

Hereinbelow, the present invention is described in detail with reference to the accompanying drawings. FIG. 1 is a view showing a configuration of a semiconductor thin film crystallization device of this embodiment. The semiconductor thin film crystallization device is made up a first laser oscillator 1, a first intermediate optical system 2, a second laser oscillator 3, a second intermediate optical system 4 and a substrate drive unit 5. Then, a substrate 6 placed on the substrate driver unit 5 is irradiated with laser beams derived from the first laser oscillator 1 and the second laser oscillator 3.

The first laser oscillator 1 and the first intermediate optical system 2 constitute an example of the first laser irradiation unit. The second laser oscillator and the second intermediate optical system 4 constitute an example of the second laser irradiation unit. The substrate driver unit 5 constitutes an example of a relative moving unit.

Although not shown in FIG. 1, the semiconductor thin film crystallization device may include a variable attenuator for correcting beam intensity, a shutter for interrupting the beam, various types of detectors for measuring laser intensity, an adjustment unit for substrate temperature, chamber units for controlling the gas atmosphere around the substrate, and the like.

Further, a semiconductor thin film (not shown) is formed on the substrate 6. The semiconductor thin film is crystallized by solidification after fusion. It is noted that silicon thin film or amorphous silicon thin film or other semiconductor materials may be used as the semiconductor thin film.

In this embodiment, the semiconductor thin film on the substrate 6 is crystallized by using the semiconductor thin film crystallization device having the above-described constitution. The method for this crystallization includes the supplying of energy necessary for the fusing of the semiconductor thin film primarily by irradiation with a laser beam derived from the first laser oscillator 1, and the giving of a preliminary effect by irradiation with a laser beam derived from the second laser oscillator 3. Then, by a composite effect of the irradiation with the two laser beams, the method simultaneously achieves the crystal growth ten or more larger than the conventional counterpart, crystal quality of less defects and ridge-free flat crystal surfaces, as well as high throughput.

First, a first crystallization method according to this embodiment is explained.

The first laser oscillator 1 may be a laser oscillator of either continuous oscillation or pulsed oscillation. However, it is preferable to use a laser oscillator that performs pulsed oscillation to emit a pulsed energy beam. Also, the first laser oscillator 1 is not particularly limited in its light source type if its emission wavelength can be set to within a range of 550 nm to 200 nm so that a certain degree or higher of absorption for silicon is given to make the fusing achievable. For example, the light source is desirably implemented by various types of solid state laser devices, which are typified by excimer laser devices that oscillate ultraviolet rays or YAG laser devices that converts infrared oscillated light into a doubled harmonic wave, or solid state ultraviolet laser devices that have wavelengths of the ultraviolet region such as the harmonics.

Further, as the first laser beam emitted from the first laser oscillator 1, it is the most desirable to use a beam having the pulse width of 10 ns to 200 ns and the oscillation frequency of 1 kHz to 100 kHz with use of a solid state laser device which performs pulsed oscillation at the wavelength region (550 nm to 200 nm). For such a laser device, it is possible to use second harmonics of the YAG lasers (which normally mean Nd:YAG lasers), Nd:YVO$_4$ lasers, Nd:YAlO$_3$ lasers, ruby lasers, Ti:sapphire lasers, glass lasers and the like.

The second laser oscillator 3 is a laser oscillator which gives a preliminary effect for the fusing of the semiconductor thin film as described above, and a laser oscillator of either continuous oscillation or pulsed oscillation is usable therefor. The second laser oscillator 3 is preferably the one providing a pulsed energy beam. However, the second laser oscillator 3 does not necessarily need to be a laser oscillator that performs pulsed oscillation. A laser beam of continuous oscillation may be modulated by a proper method.

Also, the emission wavelength of the second laser oscillator may be the one that can be absorbed into silicon in a certain degree or higher so as to fuse silicon. However, other wavelengths are usable as well. For instance, as the second laser device, it is possible to use various types of solid state laser devices typified by excimer lasers or YAG lasers, or gas laser devices of carbonic acid gas lasers or argon ion lasers or the like.

The most desirable wavelength as the second laser oscillator is a wavelength which yields the more absorption at the substrate 6. More specifically, the second laser beam is given by using a carbonic acid gas laser device having an emission wavelength of about 10 microns and by a pulse width of 1 μs to 100 μs and a pulse repetition frequency equal to that of the first laser beam (i.e., 1 kHz to 100 kHz). Such a laser beam can be obtained normally by modulating a CW carbonic acid gas laser.

Figure 2:
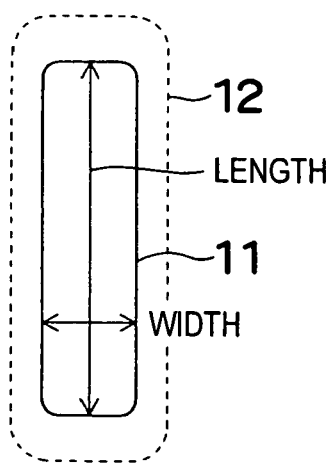
FIG. 2 is a view showing a shape of a beam spot formed by the semiconductor thin film crystallization device shown in FIG. 1.

FIG. 2 shows a preferable spot shape at a laser beam irradiation surface, which is formed by the semiconductor thin film crystallization device of this embodiment. Referring to FIG. 1, a first laser beam emitted from the first laser oscillator 1 is converged onto the semiconductor thin film on the substrate 6 by the first intermediate optical system 2 to form a slit-shaped first beam spot 11 having a specified length and a specified width. The width in this case is 5 microns to 50 microns. The length is preferably so as to yield enough intensity to fuse the semiconductor thin film on the substrate 6 with such a width of 5 microns to 50 microns and to be as long as the power of the first laser oscillator 1 permits, from the viewpoint of reduction in the time required for crystallization process.

Generally, amorphous silicon is used as the semiconductor thin film on the substrate 6, its thickness being 50 nm. In this case, when a solid state laser device having a wavelength of 532 nm and a pulse width of 10 ns to 100 ns is used as the laser device for the first laser oscillator 1, fusion occurs with energy of 200 mJ/cm$^2$ to 600 mJ/cm$^2$ upon irradiation with only the first laser beam. Therefore, designing the shape of the first beam spot 11 to yield an energy density roughly of the above level makes it possible to properly fulfill the crystallization.

A light intensity distribution at the beam spot (first beam spot) 11 on the surface of the semiconductor thin film, which is formed by the first laser beam from the first laser oscillator 1, has a rise (fall) of the intensity preferably as abruptly as possible at edge portions in the short side (width) direction of the first beam spot 11. Desirably, a distance over which the intensity changes from 10% to 90% is about 2 microns or less. On the other hand, in the longer side (length) direction of the first beam spot 11, it is desired that the light intensity is constant, its variations desirably being ±5% or less. The edge portions in the longer side direction of the first beam spot 11 desirably have the same rises (falls) as those of the edge portions in the shorter side direction.

The shape of a beam spot (second beam spot) 12, which is formed on the surface of the semiconductor thin film by the second laser beam derived from the second laser oscillator 3, is set to a shape generally similar to the spot shape of the first beam spot 11. Preferably, the second beam spot 12 has such a size and a shape that at least the first beam spot 11 is contained therein geometrically. Also, desirably, the light intensity distribution by the second laser beam in the second beam spot 12 is constant at its portion overlapping with the first beam spot (including rising portion and falling portion).

It is noted here that the terms "light intensity (distribution) constant" as mentioned above mean that the light intensity distribution is constant from a design's point of view, and so regarded as constant even if the intensity varies to some extent depending on manufacture variations.

Figure 3A:
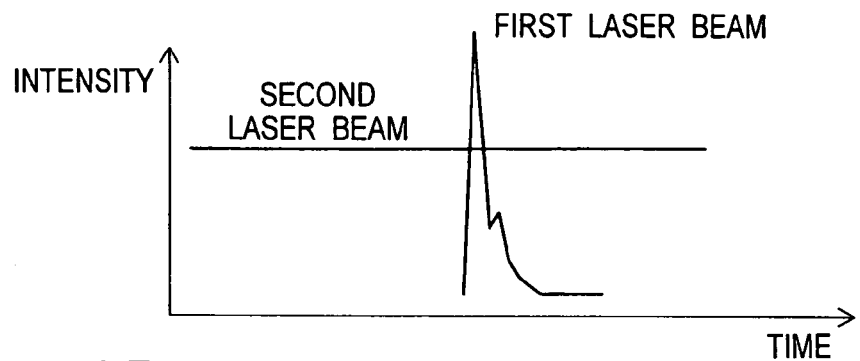
FIGS. 3A and 3B are views showing relationship between irradiation time and intensity of a first laser beam derived from a first laser oscillator and a second laser beam derived from a second laser oscillator in FIG. 1.
Figure 3B:
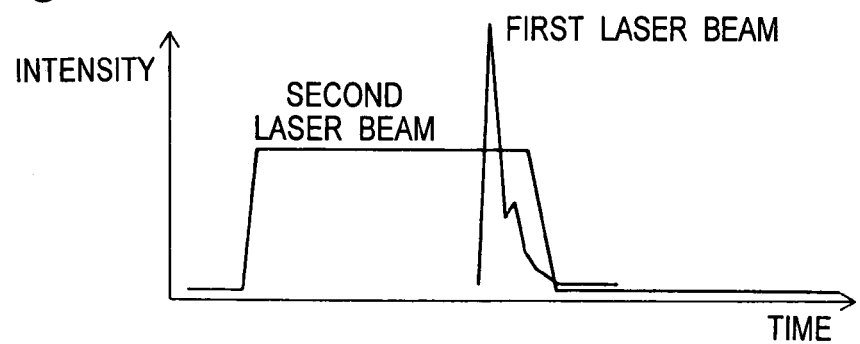

FIGS. 3A and 3B show relationships in irradiation time and intensity between the first laser beam derived from the first laser oscillator 1 and the second laser beam derived from the second laser oscillator 3. In the case of this embodiment, the intensity versus irradiation time relationship between the first laser beam and the second laser beam can be given mainly in two types.

As to how to give the intensity in relation to first irradiation time, the first laser beam is emitted as pulsed irradiation while the second laser beam is continuously emitted as continuous irradiation, as shown in FIG. 3A (first method). It is noted here that the intensity of the second laser beam is a specified intensity lower than the highest intensity of the first laser beam. The pulse interval of the first laser beam in this method depends on the repetition frequency of oscillation of the first laser oscillator 1. As the first laser device, a solid state laser device of pulse oscillation is used, which is YAG lasers (which normally mean Nd:YAG lasers), Nd:YVO$_4$ lasers, Nd:YAlO$_3$ lasers, ruby lasers, Ti:sapphire lasers, glass lasers, etc. In the case of using its second harmonics, the repetition frequency of oscillation can be set to 1 kHz to 100 kHz.

As to how to give the intensity in relation to second irradiation time, the second laser beam is emitted as pulsed irradiation while the first laser beam is emitted in a pulsed manner as well as shown in FIG. 3B (second method). It is noted here that the intensity of the second laser beam is a specified intensity lower than the highest intensity of the first laser beam. In this case, a laser device equivalent to that of the first method can be used for the first laser beam, where the second laser beam is emitted in synchronization with the first laser beam. For this purpose, the pulse width of the second laser beam is set larger than the pulse width of the first laser beam. Then, the timing of irradiation start with the second laser beam is made at least precedent to the timing of irradiation start with the first laser beam. Also, the timing of irradiation end with the second laser beam is preferably set later than the timing of irradiation end with the first laser beam.

In the second method, the irradiation time (pulse width) with the second laser beam is preferably set as short as possible. With this setting, the irradiation energy density of the second laser beam per unit area and per unit time needs to be set higher according to the reduction in pulse width. On the other hand, the setting of a shorter irradiation time makes it possible to reduce the input amount of heat into the substrate 6, the input amount of heat being expressed as "pulse width" multiplied by "irradiation energy density." The reason for this is that the setting of a shorter irradiation time (pulse width) allows heating performed by the second laser beam to be heating almost in a heat-insulated state. As a result, it is possible to reduce the heat which escapes due to thermal diffusion before the irradiation of the first laser beam, and therefore, to limit the heated region to the surface of the substrate 6, thus making it achievable to heat only the surface with a small amount of heat. Thus, the second method has an effect of preventing increase of temperature in the whole substrate 6, so that deformation of the substrate 6 due to thermal expansion can be prevented.

Figure 4:
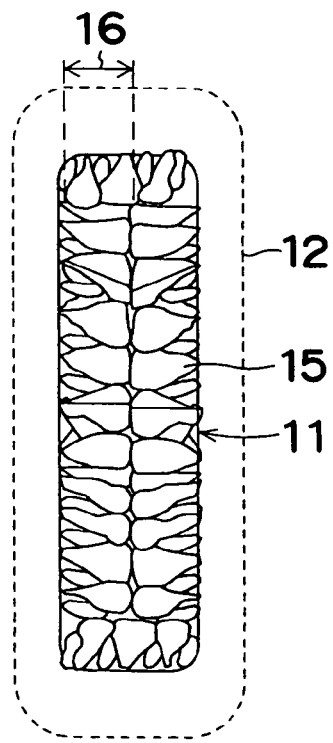
FIG. 4 is a view showing a crystallization state in a case where a semiconductor thin film is irradiated with the beam spot shown in FIG. 2.

Next, the explanation is given as to the crystal state resulting from the crystallization of the semiconductor thin film on the substrate 6 performed under the above-described settings, and the drive method for the substrate in such case. FIG. 4 shows a state of crystals in a case where the semiconductor thin film is irradiated with the first laser beam and the second laser beam. As shown in FIG. 4, together with the irradiation of the first laser beam and the second laser beam, the semiconductor thin film on the substrate 6 fuses and, starting to be cooled after the termination of the irradiation, yielding solidification and crystallization. The fusion of the semiconductor thin film in this case occurs generally within the region of the first beam spot 11. Crystal solidification, which starts from the crystal nuclei and which is generated randomly from end portions, progresses from both-side edge portions of the region of the first beam spot 11. As a result of this, as shown in FIG. 4, there can be obtained a plurality of crystals 15 which have laterally grown in the widthwise direction of the first beam spot 11 and toward the center portions. In this embodiment, while this lateral crystal growth is kept occurring, irradiation of the second laser beam is applied compositely. This causes extremely large crystal growth. It is noted that the growth length of the crystals 15, although varying depending on conditions, is 2.5 microns to 25 microns for each one time of irradiation, which is approximately 2.5 to 25 times, about ten times on the average, the growth length described in the patent document 3 (1 micron to 2 microns).

In addition, that the growth length 16 for each one time of irradiation is ten times on the average that of the patent document 3 means that tenfold throughput can be obtained at all times as compared with the patent document 3. Thus, it can be said that an extremely high productivity can be obtained according to this embodiment.

More specifically, a solid state laser device having a wavelength of 532 nm, a pulse width of 30 ns and an irradiation intensity of 300 mJ/cm$^2$ is used as the first laser device. A carbonic acid gas laser device having a wavelength of 10.6 μm, a pulse width of 100 μs and an irradiation intensity of 40 W/mm$^2$ is used as the second laser device. Then, in a case where the width of the first and second beam spots is about 20 microns, a crystal growth length of 10 microns for each one time of irradiation can be obtained.

In this embodiment, the width of the first beam spot 11 is set to 5 microns to 50 microns as described above. Accordingly, on the basis that the crystal growth length 16 of 2.5 microns to 25 microns for each one time of irradiation can be obtained, it is implementable to obtain crystals 15 that have generally grown up to the roughly center portion of the irradiation region of the first beam spot 11.

Whereas the crystallization yielded by one time of irradiation with the laser beam is as described above, such crystallization is performed while the substrate 6 is being moved (or the first beam spot 11 and the second beam spot 12 are being moved in equal direction and at equal speed) in this embodiment.

Figure 5:
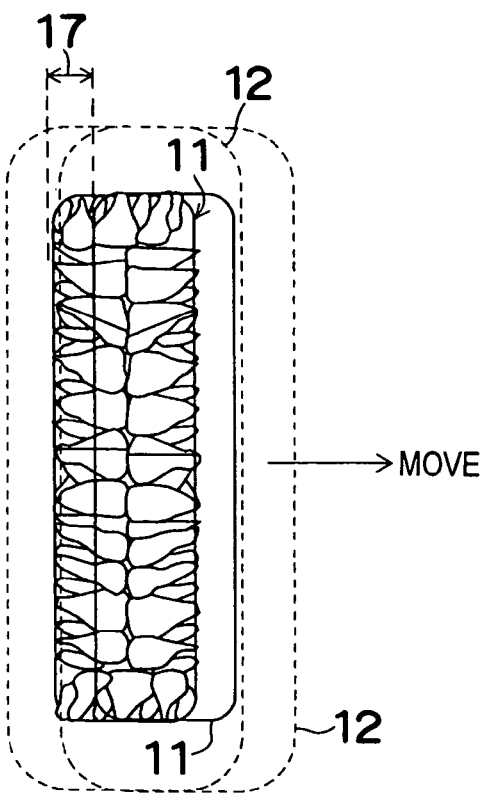
FIG. 5 is a view showing a relationship between moving distance of the beam spot and the crystallization state.

FIG. 5 shows a relationship between the shape of the beam spots 11, 12 and the moving distance 17. The move of the substrate 6 (or beam spots 11, 12) may be either intermittent or continuous. For instance, as a preferred example, when the pulse width of the first laser beam is set to 10 ns to 200 ns, the distance to which the substrate 6 moves is extremely small with practical speed. Therefore, the move of the substrate 6 can be done continuously without being stopped for each time of irradiation, which makes it possible to adopt a simple method that the substrate 6 is continuously fed. However, in either case of intermittent or continuous feed, the distance 17 to which the substrate 6 is moved for each one time of irradiation is set to not less than ½ time and not more than 1 time the growth length of crystals by roughly one time of irradiation. Otherwise, the distance is set to not less than ¼ time and not more than ½ time the width of the first beam spot 11.

The moving speed of the substrate 6 in this case is determined by "moving distance for one time irradiation" multiplied by "repetition frequency of oscillation of first, second laser oscillators 1, 3." Accordingly, typically, the moving speed is 10 microns×10 kHz=100 mm/s, which means that the whole substrate 6 can be crystallized at a practical high speed. For example, even in the case of a several hundred millimeter square glass substrate, the substrate 6 can be irradiated from its one end to the other end in several seconds.

Figure 6:
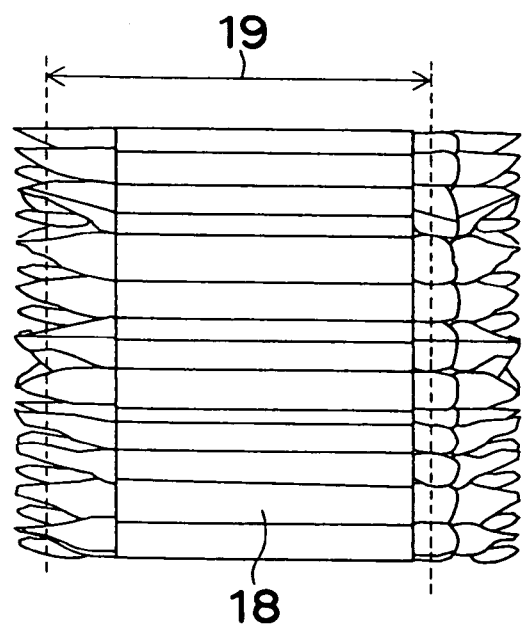
FIG. 6 is a view showing crystals obtained by the first crystallization method in which the substrate or the beam spot is moved.

As the result, as shown in FIG. 6, a plurality of crystals 18 extending in one way and free from ridges can be obtained on the substrate 6 by using such a crystallization method as described above, in which irradiation with the single linear-shaped first beam spot 11 is applied at a relatively high repetition frequency, in which large crystal growth is yielded by the second beam spot 12, and in which the crystallization is carried out while the substrate 6 or the beam spots 11, 12 are moved. In this case, since there are no ridges in the region to which the substrate 6 (beam spots 11, 12) is moved, flat crystals 18 are obtained. Thus, when the substrate 6 (beam spots 11, 12) is moved from one end to the other end of the substrate 6, a thoroughly ridge-free, flat crystallized region is obtained from one end to the other end of the substrate 6. That is, it is substantially possible to obtain the entire substrate 6 having unidirectionally grown crystals and a ridge-free surface.

As described above, the first crystallization method of this embodiment makes it possible to yield ten or more times the conventional crystal growth by applying a composite irradiation with the second beam spot 12 (most desirably, a beam spot by a carbonic acid gas laser beam) in addition to the linear irradiation having a width of 5 micron to 50 microns by the first beam spot 11. Accordingly, by iterating the irradiation with the beam spots 11, 12 a plurality of times and simultaneously moving the substrate 6, it becomes implementable to fabricate a high-quality, ridge-free crystal thin film on the whole substrate 6 at practical speed.

Consequently, according to this embodiment, taking over the grown crystals makes it possible to obtain continuously, laterally grown crystals. Also, doing the crystallization at high speed as described above makes it possible to implement the crystallization over the whole semiconductor thin film on the substrate 6. Further, since the continuous crystallization can be implemented from one end portion to the other end portion of the semiconductor thin film on the substrate 6, it is implementable to obtain crystals which are free from the presence of ridges therebetween so that their surfaces are extremely flat.

Accordingly, transistors of quite high characteristics are obtained in the case where the transistors are formed by using the substrate crystallized according to this embodiment. For instance, after stacking a $SiO_2$ ground layer and amorphous silicon (50 nm) on a glass substrate, the crystallization of the amorphous silicon is performed according to this embodiment. In the case where the channel direction of the transistors are formed in line with the growth direction of this crystallization, a mobility of 300 cm$^2$/Vs to 400 cm$^2$/Vs can stably be obtained. This is equivalent to two to three times the mobility disclosed in the patent document 1, which is a dramatic improvement. Furthermore, as to the irregularities of the surface, there are no ridges and the average roughness is not more than 5 nm, so that the average roughness can be made not more than 1/10 of normal average roughness.

Next, the second crystallization method according to this embodiment is explained. Also for this second crystallization method, the semiconductor thin film crystallization device shown in FIG. 1 is used.

As shown in FIG. 7, first of all, irradiation with the first and second laser beams is performed at least one time to a first strip region 21, which ranges from one end portion to the other end portion of the substrate 6, along one edge portion close to one side out of the four sides of the semiconductor thin film 20 on the substrate 6. Thereby, first strip crystallization of the semiconductor thin film is performed. In this process, the width of the first strip region 21 is generally equal to the length of the first beam spot (see FIG. 2).

Next, the substrate 6 rotated 90°, and thereafter, irradiation with the first and second laser beams is performed to a second strip region 23, which ranges from one end portion to the other end portion of the semiconductor thin film 20, the one end portion being within the first strip region 21 serving as a start point (more precisely, the start point is a position 22 within the first strip region 21). Thereby, second strip crystallization of the semiconductor thin film is performed. In this case also, the width of the second strip region 23 is generally equal to the length of the first beam spot. After this on, the second strip crystallization on the second strip region 23 is iterated a plurality of times, by which crystallization all over the substrate 6 is achieved.

According to this second crystallization method, the start point 22 for the second strip crystallization is positioned within the first strip region 21. Since crystals elongated in the longitudinal direction of the first strip region 21 have already grown at the portion of the start point 22, crystal growth of the second strip region 23 starts with the crystals in the first strip region 21 as the seeds. Accordingly, the crystals that grow in the second strip region 23 are not those which grow with the start point given by crystal nuclei generated randomly from end portions, but those which start to grow with the start point given by the crystals elongated in the longitudinal direction of the first strip region 21. For this reason, the crystal that grows in the second strip region 23 is not the plurality of elongated crystals that have grown as in the case of the first strip region 21, but a crystal of an extremely large width or almost such a crystal.

Thus, the crystals formed in the semiconductor thin film by the second strip crystallization are those of good quality having extremely few defects and close to the single crystal. Also, as a result of reduction in defects, there can be obtained an effect that the formation of transistors in the crystallized region is subject to less effects of defects no matter how the channel of the transistors is oriented, thus eliminating constraints on the orientation of the transistor placement.

Next, the semiconductor thin film crystallization device according to this embodiment is explained. As shown in FIG. 1, a first laser beam emitted from the first laser oscillator 1 is changed by the first intermediate optical system 2 so as to form a first beam spot 11 as shown in FIG. 2 on the substrate 6 (above-noted semiconductor thin film). It is noted here that the first intermediate optical system 2 may be either an optical system that changes the beam into a plurality of laser beams or an optical system that changes the beam into a single laser beam. As shown below, however, the change into a single laser beam is preferred.

As the first laser device, it is preferable to use a solid state laser device of pulsed oscillation, in particular, which includes YAG lasers (which normally mean Nd:YAG lasers), Nd:YVO$_4$ lasers, Nd:YAlO$_3$ lasers, ruby lasers, Ti:sapphire lasers, glass lasers and the like. With respect to its second harmonics, it is preferable to change into a single laser beam by using the first intermediate optical system 2 when the pulse width is set to 10 ns to 200 ns and the repetition frequency of oscillation is set to 1 kHz to 100 kHz.

This is because the substrate 6 can be irradiated from its one end to the other end by using a beam spot of the single laser beam. As a result of this, various effects described above can be produced.

More specifically, the moving speed of the substrate 6 is determined by "moving distance for one time irradiation" multiplied by "repetition frequency of oscillation of first, second laser oscillators 1, 3." Accordingly, typically, the moving speed is 10 microns×10 kHz=100 mm/s, meaning that the whole substrate 6 can be crystallized at a practical high speed. For example, even in the case of a several hundred millimeter square glass substrate, only several seconds is required to irradiate the substrate 6 from its one end to the other end. Also, while moving the substrate 6 or the beam spots 11, 12, the crystallization by such a crystallization method as described above makes it possible to obtain a plurality of crystals 18 extending in one way and free from ridges on the substrate 6 as shown in FIG. 6. In this case, there are no ridges in the region where the substrate 6 (beam spots 11, 12) is moved, so that flat crystals 18 can be obtained. Thus, in the case where the substrate 6 (beam spots 11, 12) is moved from one end to the other end of the substrate 6, it is possible to obtain a thoroughly ridge-free, flat crystallized region from one end to the other end of the substrate 6. That is, the entire substrate 6 can be formed substantially into unidirectionally grown crystals and a ridge-free surface.

In the case of using a plurality of laser beams, as described above, it is impossible to obtain an irradiation method that allows the substrate 6 to be irradiated from one end to the other end, and it is also impossible to prevent occurrence of ridges.

A specific structure of the first intermediate optical system 2 is explained below. FIGS. 8A and 8B show a structure of a first example of the first intermediate optical system 2. It is noted that FIG. 8A is a front view and FIG. 8B is a side view.

Convex lenses 31, 32 have a beam expander function, and are capable of changing the diameter of the first laser beam derived from the first laser oscillator 1. Then, the first laser beam changed in beam diameter is inputted to a holographic element 33 and converged onto the substrate 6 by the holographic element 33 to form a first beam spot 11 of the shape illustrated in FIG. 2. In this case, the beam intensity distribution at the first beam spot 11 shows shapes as indicated by reference numeral "34" in the drawings.

It is noted that, the intensity distribution within the first beam spot 11 preferably rises (or falls) as abruptly as possible at the edge portions of the first beam spot 11 in the shorter-side (widthwise) direction thereof, as described before. In the longer-side (lengthwise) direction of the first beam spot 11, preferably, the intensity distribution is constant, and rises (or falls) at the edge portions equivalently in the case of the shorter-side direction.

The intensity distribution of the first laser beam, although varying depending on the type of the laser device, shows in many cases Gaussian distribution or a distribution similar to Gaussian distribution. Therefore, this Gaussian distribution needs to be changed into such an intensity distribution described above. With the constitution of the first intermediate optical system 2 shown in FIGS. 8A and 8B, the hologram 33 provides the changing function of intensity distribution. Specifically, periodic or aperiodic dips and bumps formed on the surface of the transparent holographic element 33 make it possible to diffract a laser beam toward a desired direction. The resulting diffracted light is combined together to obtain a desired intensity distribution on the substrate 6.

Figure 9A:
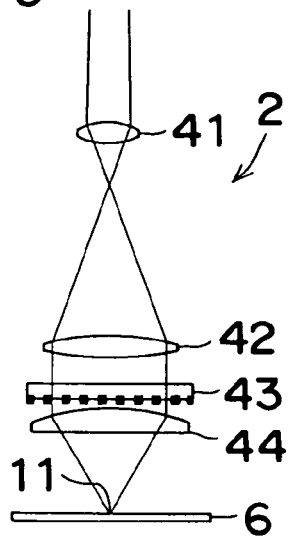
FIGS. 9A and 9B are views showing a specific configuration of the first intermediate optical system other than that of FIGS. 8A and 8B.
Figure 9B:
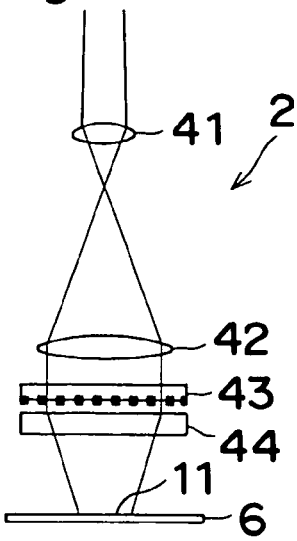

FIGS. 9A and 9B show a structure of a second example of the first intermediate optical system 2. FIG. 9A is a front view and FIG. 9B is a side view thereof.

Convex lenses 41, 42 have a beam expander function, and are capable of changing the diameter of the first laser beam derived from the first laser oscillator 1. Then, the first laser beam changed in beam diameter is inputted to a holographic element 43 and converged onto the substrate 6 by the holographic element 43 and a cylindrical lens 44 to form a first beam spot 11 of the shape illustrated in FIG. 2. In this case, the beam intensity distribution at the first beam spot 11 shows shapes as indicated by reference numeral "45" in the drawings.

It is noted that the intensity distribution within the first beam spot 11, as in the case of FIGS. 8A and 8B, preferably rises (or falls) as abruptly as possible at the edge portions of the first beam spot 11 in the shorter-side (widthwise) direction thereof. In the longer-side (lengthwise) direction of the first beam spot 11, preferably, the intensity distribution is constant, and rises (or falls) at the edge portions equivalently in the case of the shorter-side direction.

In the constitution of the first example of the first intermediate optical system 2 shown in FIGS. 8A and 8B, the hologram 33 changes the intensity distribution 34 into a desired one. In contrast to this, in the constitution of the second example shown in FIGS. 9A and 9B, a change into a desired intensity distribution 45 is fulfilled by a multifunction of the holographic element 43 and the cylindrical lens 44. It is noted that the cylindrical lens 44 is so placed that the direction of its generatrix coincides with the lengthwise direction of the first beam spot 11.

More specifically, as shown in FIG. 9B, the hologram 43 has a function of uniformizing the intensity in the longer-side (lengthwise) direction of the first beam spot 11. In contrast to this, the cylindrical lens 44 is placed so as to have no image-forming effect in this direction. Conversely, as shown in FIG. 9A, the cylindrical lens 44 has the image-forming function in the shorter-side (widthwise) direction of the first beam spot 11, and converges the laser beam into a desired width. Thus, a desired intensity distribution is obtained on the substrate 6.

According to the constitution of this second example, the hologram 43 needs only to have the function of intensity uniformization, and does not need to have the function of converging the first beam spot 11 in the widthwise direction. In this case, the hologram 43 does not need to have any optically large power, so that a relatively large pitch of concaves and convexes of the hologram can be taken. Accordingly, the hologram becomes easier to make up.

Figure 10A:
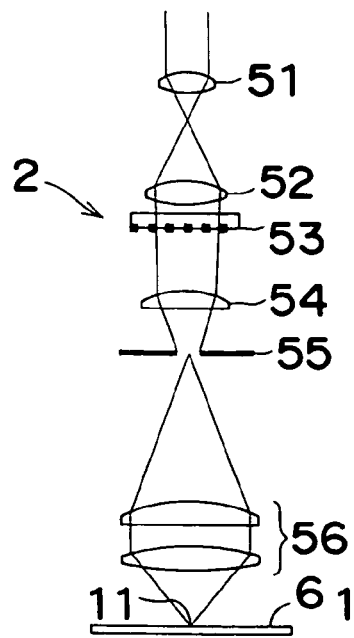
FIGS. 10A and 10B are views showing a specific configuration of the first intermediate optical system other than those of FIGS. 8A and 8B and FIGS. 9A and 9B.
Figure 10B:
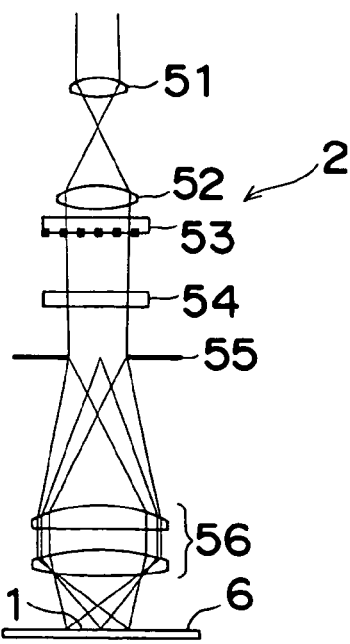

FIGS. 10A and 10B show the structure of a third example of the first intermediate optical system 2. FIG. 10A is a front view and FIG. 10B is a side view.

Convex lenses 51, 52, having a beam expander function, are capable of changing the diameter of the first laser beam derived from the first laser oscillator 1. Then, the first laser beam changed in beam diameter is inputted to a holographic element 53, making a cylindrical lens 54 irradiated with the holographic element 53.

The holographic element 53 has a function of intensity uniformization in the longer-side (lengthwise) direction of the first beam spot 11 by making the laser beam diffracted toward a desired direction with use of concaves and convexes formed on its surface. In contrast to this, the cylindrical lens 54, as shown in FIGS. 10A to 10B, is placed in such an orientation as to have the image-forming function in the shorter-side (widthwise) direction of the first beam spot 11 and not to have the convergence effect in the longer-side (lengthwise) direction. Then, the cylindrical lens 54 converges the laser beam, with which a slit 55 is irradiated once.

The slit 55, having a shape similar to that of the foregoing first beam spot 11 of a desired shape, gives a limitation on the intensity distribution of the laser beam. Further, properly designing the slit configuration of the slit 55 makes it possible to form an intensity distribution of any arbitrary configuration. The image of the slit 55 is focused on the substrate 6 by the image-forming lens (group) 56. Thus, a desired intensity distribution 57 is obtained on the substrate 6.

According to this third example, an image of the slit 55 is focused by the image-forming lens (group) 56. Therefore, the intensity distribution becomes sharper at edge portions of the first beam spot 11, facilitating the obtainment of clear images. Further, selecting a slit configuration in the slit 55 makes it possible to obtain a beam spot of any arbitrary configuration, facilitating the optimization of crystallization.

Figure 11:
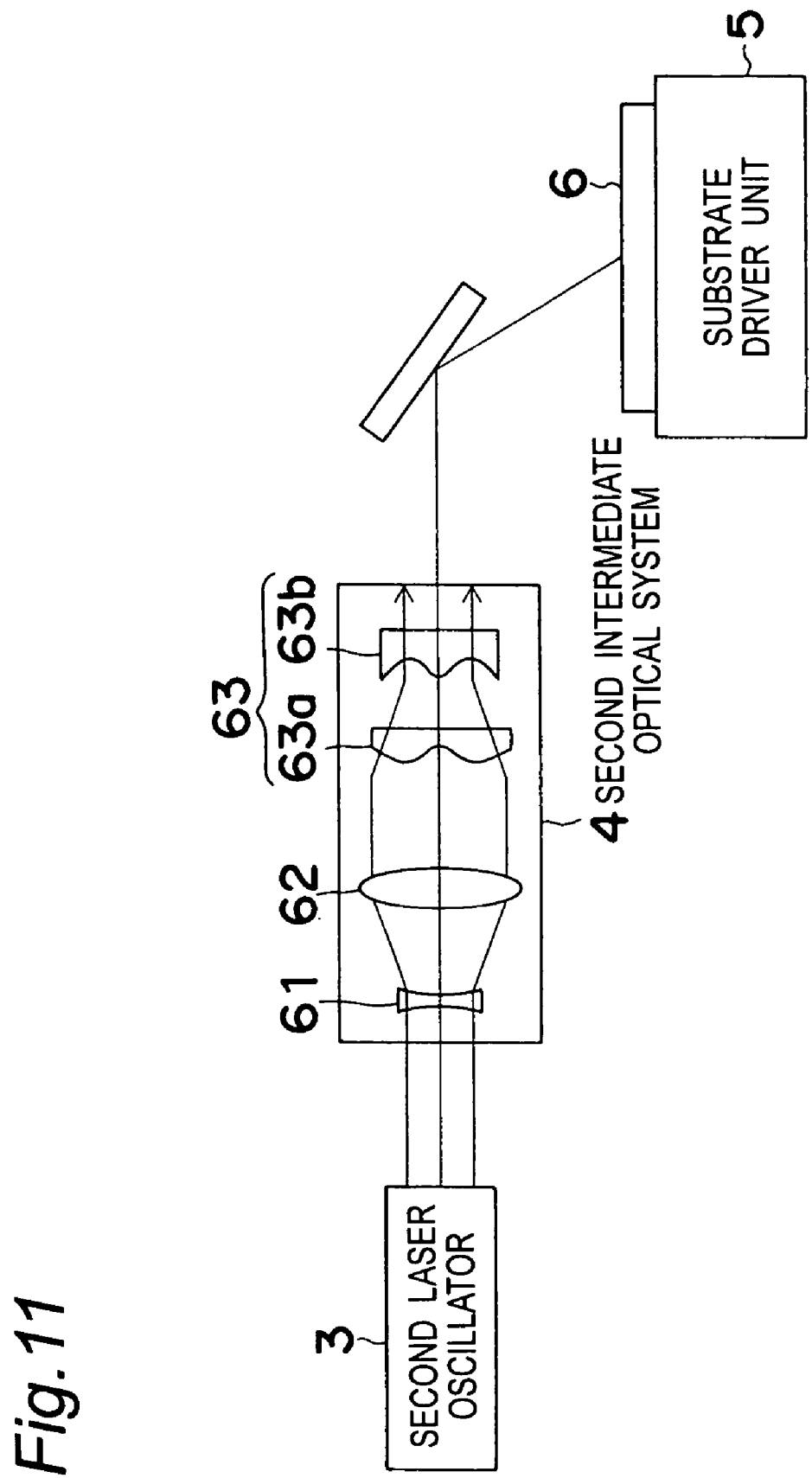
FIG. 11 is a view showing a specific configuration of a second intermediate optical system in FIG. 1.

Next, a specific structure of the second intermediate optical system 4 that converges a laser beam derived from the second laser oscillator 3 to form a second beam spot 12 on the substrate 6 is explained. FIG. 11 shows a structure of a first example of the second intermediate optical system 4.

Lenses 61, 62 have a beam expander function, and are capable of changing the diameter of the second laser beam derived from the second laser oscillator 3. Then, the second laser beam changed in beam diameter is inputted to an intensity uniformizing element 63, and converged onto the substrate 6 by the intensity uniformizing element 63 to form the second beam spot 12. The intensity uniformizing element 63, which is composed of two aspherical lenses 63a, 63b, changes a laser beam having an intensity distribution derived from the second laser oscillator 3 into a laser beam of uniform intensity.

Figure 12:
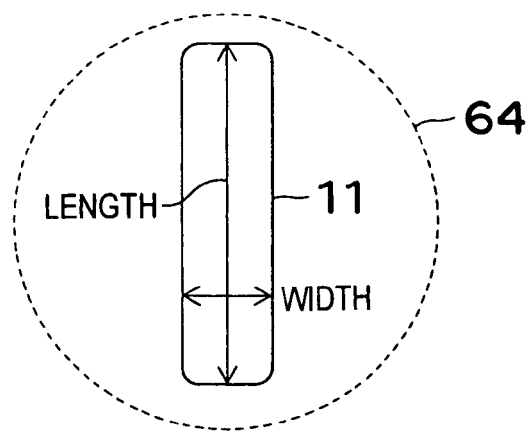
FIG. 12 is a view showing a shape of a second beam spot derived from the second intermediate optical system shown in FIG. 11.

Normally, when a single-mode carbonic acid gas laser is used as the second laser device of the second laser oscillator 3, the resulting intensity distribution is Gaussian distribution. Therefore, if irradiation is applied as it is, the action of crystallization varies depending on the irradiation region. For this reason, uniformizing the intensity by the intensity uniformizing element 63 makes it possible to obtain a uniform crystallization action within the second beam spot 12. In this case, the second beam spot on the substrate 6 results in a circular beam spot 64 as shown in FIG. 12, the first beam spot 11 being contained in the second beam spot 64.

Figure 13A:
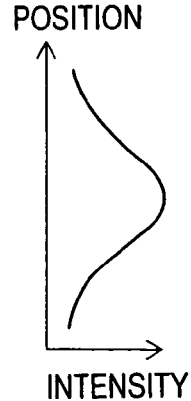
FIGS. 13A to 13C are views showing an action of an intensity uniformizing element in FIG. 11 on light beams.
Figure 13B:
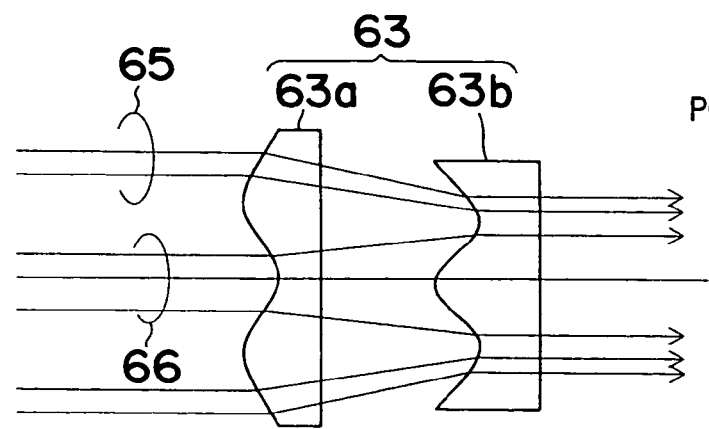
Figure 13C:
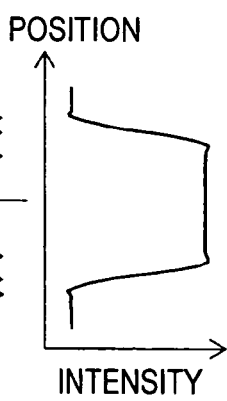

FIGS. 13A to 13C shows an action of the uniformizing element 63 in FIG. 11 on light beams. Referring to FIG. 13B, light beam groups 65, 66 are inputted to an aspherical lens 63a of the intensity uniformizing element 63, being transmitted toward an aspherical lens 63b. In this case, the intensity distribution of the inputted second laser beam forms generally Gaussian distribution as shown in FIG. 13A, where the intensity is higher in central portions and lower in peripheral portions. Then, after the transmission through the uniformizing element 63, the intensity distribution is changed into a laser beam having generally uniform intensity from central to peripheral portions as shown in FIG. 13C.

In other words, the light beam group 65, which is derived from a region exhibiting a low intensity in Gaussian distribution, is inputted to a peripheral portion of the intensity uniformizing element 63 and directed toward a roughly converging direction, as shown in FIG. 13B. Meanwhile, the light beam group 66, which is derived from a region exhibiting a high intensity, is inputted to a central portion of the intensity uniformizing element 63 and directed toward a roughly diverging direction. Thus, the light beam group 65 derived from a low-intensity region is converged so as to be increased in intensity, while the light beam group 66 derived from a high-intensity region is diverged so as to be decreased in intensity, with a result that a uniform intensity distribution can be obtained.

For specific fulfillment of this, in the intensity uniformizing element 63, the first aspherical lens 63a has such a cross-sectional shape that is concave in central portion and convex in peripheral portion as shown in FIG. 13B, which makes it possible to obtain the aforementioned uniformization effect. However, this arrangement does not allow a laser beam passed through the first aspherical lens 63a to become a parallel beam. Thus, the second aspherical lens 63b is placed so as to get the parallel beam. It should be noted that the second aspherical lens 63b may be omitted if a generally parallel laser beam is obtained by the aspherical lens 63a.

Figures 14A, 14B, 14C:
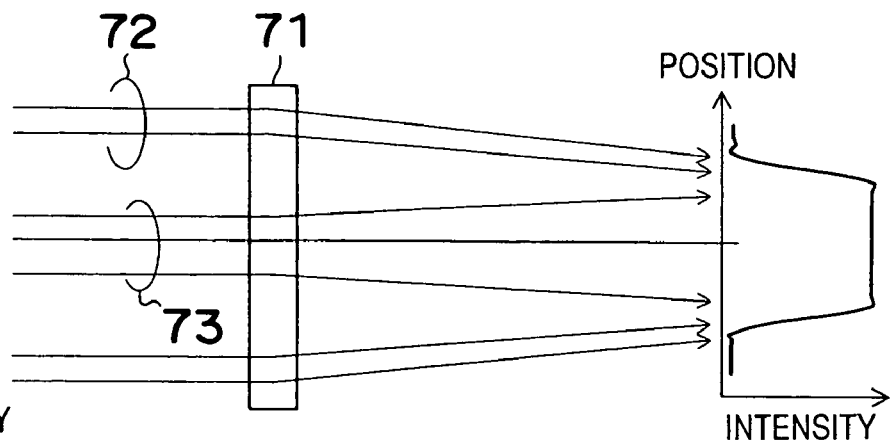
FIGS. 14A to 14C are views showing an action of an intensity uniformizing element on light beams other than in FIGS. 13A to 13C.

FIGS. 14A to 14C show an action of the intensity uniformizing element on light beams in the second example of the second intermediate optical system 4. In this second example, a holographic element 71 is used as the intensity uniformizing element. Referring to FIG. 14B, light beam groups 72, 73 are applied to the holographic element 71, and a laser beam exhibiting an intensity distribution of Gaussian distribution as shown in FIG. 14A into a laser beam exhibiting a uniform intensity distribution as shown in FIG. 14C. The holographic element 71 in this case, similar in function to the aspherical lenses 63a, 63b shown in FIGS. 13A to 13C, has a converging function for a peripheral-part light beam group and a diverging function for the central-part light beam group 73. These functions can be achieved by properly designing the pitch or depth of concaves and convexes provided on the hologram surface.

When the holographic element 71 is used as in the second example, it becomes possible to control not only the intensity distribution of the laser beams but also the shape of the beam spots, unlike the case where the first aspherical lenses 63a, 63b are used as in the first example. As to the reason of this, since the first aspherical lenses 63a, 63b are rotationally symmetrical in cross-sectional shape, the beam spot to be formed results in a circular shape 64 as shown in FIG. 12. In contrast to this, in the case where the holographic element 71 is used, there are no constraints on the shape of the beam spot by virtue of the hologram pattern's arbitrariness.

Figure 15:
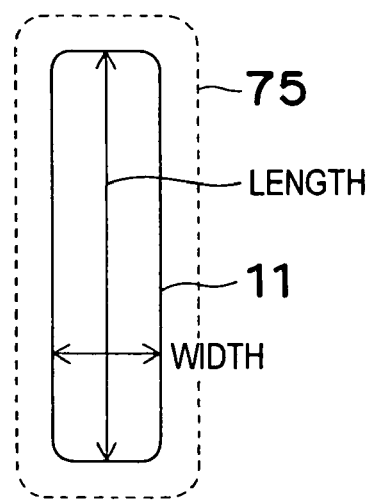
FIG. 15 is a view showing a shape of a second beam spot by the intensity uniformizing element (holographic element) shown in FIGS. 14A to 14C.

FIG. 15 shows a beam spot shape on the substrate 6 with the use of the holographic element 71. Since there are no constraints on the shape of the second beam spot, both the first beam spot 11 and the second beam spot 75 may be made rectangular. Like this, setting not a circular-shaped second beam spot 64 as shown in FIG. 12 but a rectangular-shaped second beam spot 75 allows the irradiation efficiency to be enhanced, more desirably.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor thin film crystallization method comprising the steps of:
    irradiating a semiconductor thin film on a substrate with a first laser beam to form a striped first beam spot having a specified width and a specified length on the semiconductor thin film;
    irradiating the semiconductor thin film with a second laser beam to form a second beam spot having a shape containing the first beam spot on the semiconductor thin film; and
    moving the substrate relative to the two beam spots in a widthwise direction of the first beam spot to crystallize the semiconductor thin film on the substrate by the first and second laser beams, wherein
    the irradiation with the second laser beam is performed at least while the irradiation with the first laser beam is being performed,
    intensity of the second laser beam is maintained constant during a period from an emission start time to an emission end time, and
    light intensity of the second laser beam within the second beam spot is maintained constant at least over portions overlapping with the first beam spot.

2. The semiconductor thin film crystallization method as claimed in claim 1, wherein
    the specified width of the striped first beam spot is not less than 5 microns and not more than 50 microns.

3. The semiconductor thin film crystallization method as claimed in claim 1, wherein
    the second laser beam is a carbonic acid gas laser beam.

4. The semiconductor thin film crystallization method as claimed in claim 1, wherein
    the second laser beam is a pulsed laser beam.

5. The semiconductor thin film crystallization method as claimed in claim 1, wherein
    irradiation frequency of the first laser beam is not less than 1 kHz and not more than 100 kHz.

6. The semiconductor thin film crystallization method as claimed in claim 1, further comprising the steps of:
    moving the substrate from one end portion to other end portion of the substrate along the widthwise direction of the first beam spot to crystallize one side of the semiconductor thin film on the substrate along the one side in a strip shape;
    thereafter, rotating the substrate by 90°; and
    moving the substrate a plurality of times from a start point located within the strip crystallization region to other side of the semiconductor thin film on the substrate opposite to the one side along the widthwise direction of the first beam spot, to crystallize the plurality of strip regions extending from the one side to the other side of the semiconductor thin film on the substrate.

* * * * *